United States Patent [19]

Dalal

[11] 4,377,723

[45] Mar. 22, 1983

[54] HIGH EFFICIENCY THIN-FILM MULTIPLE-GAP PHOTOVOLTAIC DEVICE

[75] Inventor: Vikram L. Dalal, Newark, Del.

[73] Assignee: The University of Delaware, Newark, Del.

[21] Appl. No.: 146,323

[22] Filed: May 2, 1980

[51] Int. Cl.³ .................. H01L 31/06; H01L 31/18
[52] U.S. Cl. .................. 136/249; 136/258; 136/259; 357/30
[58] Field of Search .......... 136/249 TJ, 258 AM, 136/259; 357/2, 30

[56] References Cited

U.S. PATENT DOCUMENTS

| | | | |
|---|---|---|---|
| 3,444,381 | 5/1969 | Wendland | 250/211 |
| 3,973,994 | 8/1976 | Redfield | 136/259 |
| 3,990,101 | 11/1976 | Ettenberg et al. | 136/255 |
| 4,017,332 | 4/1977 | James | 136/255 |
| 4,160,678 | 7/1979 | Jain et al. | 136/255 |
| 4,206,002 | 6/1980 | Sabnis et al. | 136/249 |
| 4,239,554 | 12/1980 | Yamazaki | 136/255 |
| 4,255,211 | 3/1981 | Fraas | 136/249 |
| 4,272,641 | 6/1981 | Hanak | 136/249 |
| 4,278,474 | 7/1981 | Blakeslee et al. | 136/249 |
| 4,289,920 | 9/1981 | Hovel | 136/246 |
| 4,292,461 | 9/1981 | Hovel | 136/249 |
| 4,332,974 | 6/1982 | Fraas | 136/249 |
| 4,338,480 | 7/1982 | Antypas et al. | 136/249 |

FOREIGN PATENT DOCUMENTS 2715471 10/1978 Fed. Rep. of Germany ...... 136/259
55-29154 3/1980 Japan .................................. 136/258

OTHER PUBLICATIONS

"Solid State Communications", vol. 24, pp. 867–869, 1977.
"J. Applied Physics", 48(12), Dec. 1977.
"Applied Physics Letters", 35(7), Oct. 1, 1979.
Dalal and Fagan Paper presented at 14th IEEE Photovoltaic Specialists Conference, Jan. 7–10, 1980, San Diego.
Y. Marfaing, "Evaluation of Multijunction Structures Using Amorphous Si–Ge Alloys," *Proceedings, 2nd European Photovoltaic Solar Energy Conf.* (1979), pp. 287–294.

*Primary Examiner*—Aaron Weisstuch
*Attorney, Agent, or Firm*—Connolly and Hutz

[57] ABSTRACT

A photovoltaic device includes at least two solar cells made from Group IV elements or their alloys in the amorphous state mounted on a substrate. The outermost or first cell has a larger bandgap than the second cell. Various techniques are utilized to improve the efficiency of the device.

30 Claims, 7 Drawing Figures

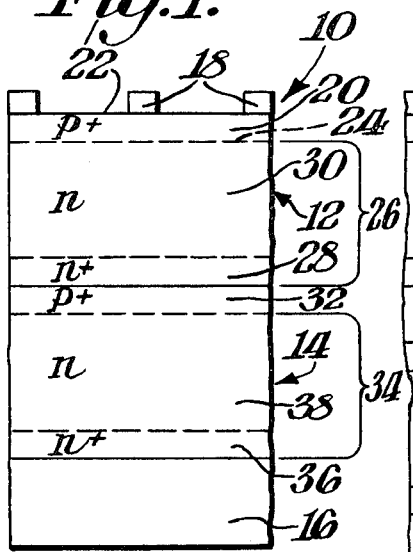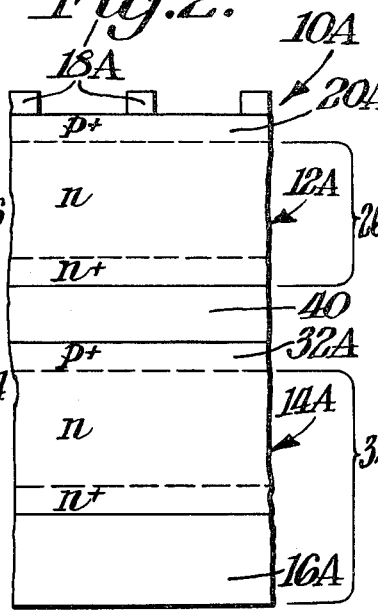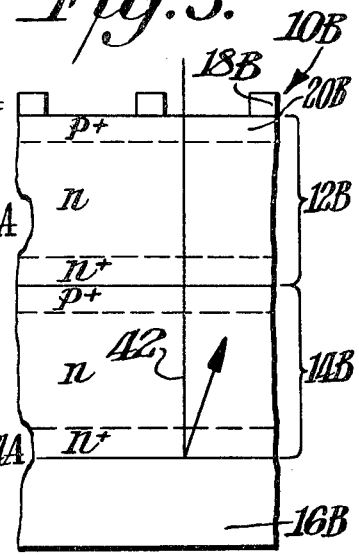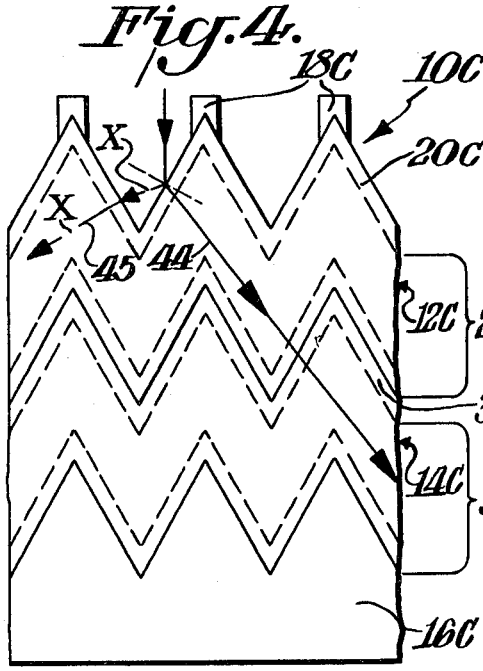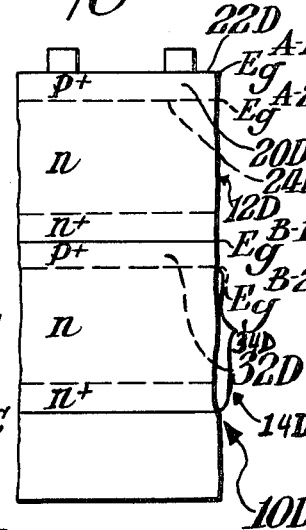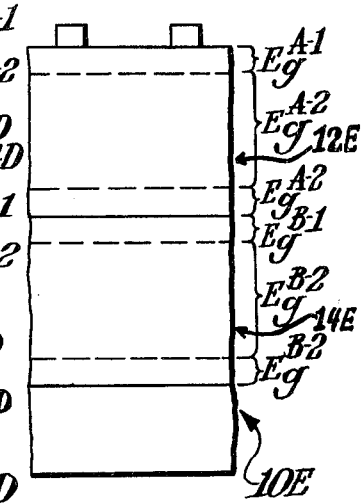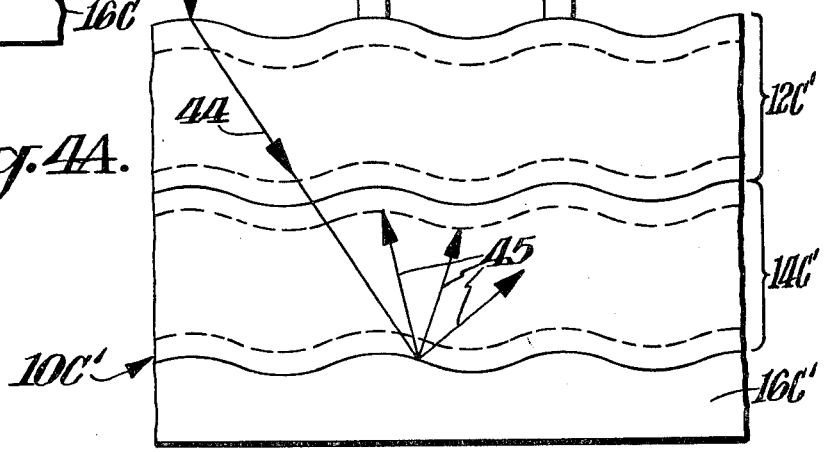

HIGH EFFICIENCY THIN-FILM MULTIPLE-GAP PHOTOVOLTAIC DEVICE

The Government has rights in this invention pursuant to Contract No. DE-AC03-79-ET-23034 between the U.S. Department of Energy and the University of Delaware.

BACKGROUND OF INVENTION

Solar cells or photovoltaic devices are well known and are made from various semiconductor materials. For example, approximately 18% efficiency of solar energy conversion has been achieved by using crystalline silicon (c-Si) material. Amorphous silicon (a-Si) is a new material which is being used for solar cell applications. The present efficiency of these cells, however, is rather low at about 6%. Despite this low efficiency, amorphous silicon is a particularly desirable semiconductor material for photovoltaic devices since a-Si has a bandgap (1.5-2.0 eV) in the range needed for high efficiency, is easy to deposit, has a high absorption coefficient whereby a thin film can absorb most of the light, and its electronic properties can be changed by doping with n and p type dopants.

A further approach taken heretofore in the photovoltaic art is to increase efficiency by using multiple gap devices which include, for example, plural cells between the transparent and opaque electrical contacts.

SUMMARY OF INVENTION

An object of this invention is to provide a photovoltaic device which utilizes an amorphous material, such as amorphous silicon, as a semiconductor with improved efficiency thereof.

A further object of this invention is to provide a method of manufacturing such device.

In accordance with this invention, the photovoltaic device includes at least two cells made from amorphous semiconductor material mounted on a substrate. The first cell, which is remote from the substrate, is of larger bandgap than the second cell.

The efficiency of such a cell may be improved by utilizing a reflecting substrate which reflects photons back into the second cell thereby permitting an increase in the bandgap of the second cell. In addition or alternatively, the substrate may be textured to achieve a higher absorption path.

In an advantageous form of this invention, a buffer layer may be provided between adjacent cells having the same bandgap as the first cell and the same polarity as the junction layer of the second cell.

In accordance with a further ramification of this invention, current collection is improved by having the junction layers in either or both cells graded in bandgap. Alternatively the junction layer in each cell may have a constant bandgap which in turn, however, is larger than the bandgap of the base layer of that cell so as to form a heterojunction.

THE DRAWINGS

FIG. 1 is a cross-sectional view on an enlarged scale schematically showing a photovoltaic device in accordance with this invention but with the cross-hatching omitted for clarity; and FIGS. 2-6 are views similar to FIG. 1 of modified forms of this invention.

DETAILED DESCRIPTION

Applicant's copending application Ser. No. 80,194 filed Oct. 1, 1979, now U.S. Pat. No. 4,251,287, discloses a photovoltaic device utilizing an amorphous semiconductor whereby by heat treating the dopant species, the dopant species from the junction layer is diffused into the base layer to create a new electrical junction below the region of the former physical junction. The same application also discloses techniques whereby the use of different dopants results in regions of different polarity or conductivity type. Applicant's copending application Ser. No. 121,802, filed Feb. 15, 1980, now U.S. Pat. No. 4,253,882, also relates to photovoltaic devices utilizing an amorphous semiconductor and to various related techniques which generally include a multiple gap photovoltaic device having at least two cells deposited on a substrate or opaque electrical contact and generally wherein the cell adjacent the opaque electrical contact is a crystalline semiconductor and the cell adjacent the transparent electrical contact is an amorphous semiconductor. The details of those two copending applications are included herein by reference thereto.

The present invention is likewise directed to improvements in photovoltaic cells which may include amorphous semiconductors and more particularly semiconductors from Group IV of the Periodic Table. Particularly preferred semiconductors are amorphous silicon (a-Si) and amorphous germanium (a-Ge). FIG. 1 illustrates in cross section (with cross-hatching omitted for clarity) a portion of a photovoltaic device 10 in accordance with this invention. As indicated therein, the photovoltaic device 10 includes a first cell 12 and a second cell 14 deposited on a substrate 16 which functions as an opaque electrical contact and with a transparent electrical contact 18 being remote therefrom. Transparent electrical contact 18 and substrate or opaque electrical contact 16 may be of forms generally known in the art such as a metal substrate 16 and a grid 18 made of any suitable material such as gold, silver, aluminum or the like. Although not shown, an encapsulation layer may also be provided above first cell 12. Cell 12 includes a junction layer 20 having a top surface 22 and a lower electrical junction 24. Cell 12 also includes a base layer 26 which, in turn, has a pair of regions, namely a base region 28 and an intermediate region 30 with a dotted line indicating the separation between the regions. Cell 14 similarly includes a junction layer 32 and a base layer 34 having a base region 36 and an intermediate region 38.

The photovoltaic device 10 illustrated in FIG. 1 is characterized by cell 12 having a higher bandgap ($E_g^A$) than the bandgap ($E_g^B$) of cell 14. In practice, the incoming solar photons have a distribution of energy such that the higher energy photons, basically those photons with energy $h\nu > E_g^A$, are mostly absorbed in cell 12, and produce a short-circuit current $J_{sc}^A$ and an open circuit voltage $V_{oc}^A$ between the contacts to the material of cell 12. The remaining photons pass through to cell 14, where most of the photons with energies $h\nu > E_g^B$ are absorbed, generating a short-circuit current $J_{sc}^B$ and an open-circuit voltage $V_{oc}^B$. An n+p+ tunnel diode comprised by layers 28 and 32 effects electrical interconnection between cells 12 and 14. When layers 28 and 32 are appropriately doped, negligible voltage is developed across the junction. Layers 28 and 32 would furthermore be made to be transparent in order to permit passage of light into cell 14.

If the device geometry and parameters are such that $J^A = J^B$, where J's are the currents under operating conditions, then the two cells 12 and 14 can be connected in series, giving use to a total device current $J = J^A = J^B$ and a total device voltage $V = V^A + V^B$. Since high energy photons are absorbed mainly in high gap material, the combined device efficiency is greater than that of either cell 12 or cell 14 alone.

In accordance with the basic practice of this invention cell 12 is made of an amorphous semiconductor such as a-Si:H or a-(Si, Ge):H with a high Si content, deposited on top of a lower bandgap amorphous semiconductor cell 14 such as a-Ge:H or a-(Si, Ge):H with higher Ge content than the material of cell 12. The substrate may consist of a low cost conducting layer such as a metal sheet, a metal film or a conducting glass film.

Cell 12 may consist of a p+nn+ (or symmetrical n+pp+) junction. The n (or p) intermediate region 30 is either lightly doped or not intentionally doped. The thickness or width $W^A$ of the base layer intermediate region 30 (n or p) is such that $W^A \leq L^A$, where $L^A$ is the carrier collection length in cell 12. The carrier collection length, $L^A$, is the sum of the depletion layer width and the minority carrier diffusion length in the base layer. By assuring $W^A \leq L^A$, photons in cell 12 are used efficiently. The bandgap $E_g^A$ of cell 12 is chosen according to optimized total device efficiency. The base region 28 (n+ or p+) is very thin, as later described.

Cell 14 has a similar p+nn+ or n+pp+ junction. The junction layer 32 (p+ or n+) is very thin so as not to absorb a significant number of photons. The bandgap $E_g^B$ of cell 14 and width $W^B$ are chosen to produce the same current $J^B$ in cell 14, as current $J^A$, i.e., $J^B = J^A$. Typically, the fill factors of both cells, 12 and 14, are approximately equal.

Photovoltaic device 10 of FIG. 1 generally represents the type of tandem multiple-gap device with which the invention is concerned. The remaining Figures, however, relate to variations thereof which particularly enhance its efficiency. In those Figures like reference numerals are used for like parts with a suffix "A", "B", etc. being added in accordance with the particular embodiment. It is to be understood that while the various Figures illustrate a device having two cells, the invention may be practiced with more than two cells following the general guidelines generally set forth herein. For example, where three or more cells are deposited on a single substrate, the cells would decrease in bandgap in accordance with the relative location of the cell with respect to the substrate wherein the cell deposited directly on the substrate would have a lower bandgap than its adjacent cell and so forth.

One aspect of this invention is providing a thin-film multiple-gap photovoltaic device where the tunnel junction connecting the adjacent cells is a heterojunction between two semiconducting amorphous layers, but the bandgaps of the two layers are not necessarily the same as the first or the second cell. This is particularly advantageous in allowing a grading of the bandgap in the second cell. The connecting tunnel junction may also be a homojunction in the first bandgap which allows grading of the bandgap of the second cell. The advantage of grading the bandgap of the second cell is to increase the current of the second cell.

FIG. 2 illustrates an advantageous feature of this invention which differs from the prior art by avoiding the type of tunnel junction used with the prior art. As shown in FIG. 2, device 10A is similar to the device of FIG. 1 and includes a substrate 16A and a transparent contact 18A with a first cell 12A and a second cell 14A. Each cell 12A, 14A includes its own junction layer 20A, 32A, respectively, and its own base layers 26A, 34A, respectively, which in turn include base regions and intermediate regions as indicated therein. The polarity of the various regions is also indicated in FIG. 2 with each cell having a p+ polarity for its junction layer, an n+ polarity for its base region and the intermediate region being intrinsic or lightly doped n region. The prior art would generally be expected to connect such cells by utilizing a tunnel junction such as, for example, the base region of a first cell being of n+ polarity and the adjacent junction layer of the second cell being of p+ polarity. Such prior art arrangement, however, would result in a serious optical loss. The shortcomings of the prior art are avoided by the inclusion of a buffer layer 40 between the first cell 12A and the second cell 14A. Buffer layer 40 is made of a material having a bandgap higher than the bandgap of the material for second cell 14A and preferably is of the same material and bandgap as first cell 12A. Additionally buffer layer 40 which is optically transparent has a conductivity type the same as that of the junction layer of second cell 14A. The provision of the buffer layer 40 permits both the first and second cells to be heavily doped for good tunnel junction performance but functions to decouple the optical and electrical transparency from current generation of the second cell.

FIG. 3 shows yet another photovoltaic device 10B in accordance with this invention. Device 10B of FIG. 3 likewise includes a first cell 12B deposited on a second cell 14B which in turn is deposited on a substrate 16B and with a transparent contact 18B also being provided. Each cell again includes its own junction and base layers. Although not illustrated, a buffer layer may likewise be provided between the cells. The characterizing feature of the FIG. 3 embodiment is in the utilization of a substrate 16B, having a light reflecting upper surface which is also the opaque contact. The reflecting contact may be any suitable material such as aluminum or silver. The use of such a reflecting substrate functions to increase device efficiency by reflecting a significant number of appropriate photons. By allowing reflection of photons, the photons are allowed a second pass through the device structure as indicated by the light beam 42. Since the reflected photons will mainly be low energy photons with energies close to $E_g^B$, the double-pass of these photons through cell 14B will increase the absorption of these photons in cell 14B, and hence result in increased current $J^B$. Therefore, to maintain the same current as $J^A$, the absorption constant of the material of cell 14B for low energy photons can be reduced, i.e. the bandgap of material of cell 14B can be increased compared to no-reflection case. Thus $V^B$ can be increased by having a reflecting substrate. Therefore, efficiency of the device will increase by having a reflector.

For efficient utilization of reflected photons, the relationship between the width $W^B$ and collection length $L^B$ of the second cell 14B should be $W^B/L^B \leq 1$, which is a condition similar to the condition for material of cell 12B.

Expected numerical simulation results are shown in Table I.

TABLE I

Influence of Reflection on Performance of a-(Si, Ge) Two-Gap Cells

| | Cell 12B | | Cell 14B | | Efficiency |
|---|---|---|---|---|---|
| | $E_g^A$ (eV) | $V_{OC}^A$ (V) | $E_g^B$ (eV) | $V_{OC}^B$ | |
| 1. No Reflection | 1.5 | 0.9 | 0.95 | 0.57 | 16.8% |
| 2. Back Surface Reflection | 1.5 | 0.9 | 1.0 | 0.6 | 17.6% |

Thus the photons which are reflected back into device 10B are useful only in second cell 14B and not in first cell 12B and the reflected photons thereby make their second pass through second cell 14B. This permits an increase in the bandgap of second cell 14B because photon absorption decreases with an increase in bandgap. Any suitable reflective substrate may be used such as aluminum or silver foil or a substrate coated with aluminum or silver. The practice of the invention could result in a 4–5% increase in efficiency.

It is to be understood that the concepts of this invention described with respect to FIG. 3 are not limited to amorphous cells but can be used to optimize efficiency in any arrangement using a plurality of variable bandgap cells. The practice of the invention is significant in permitting the use of higher bandgap material than simple current considerations would indicate.

FIG. 4 illustrates yet another embodiment of this invention wherein the photovoltaic device 10C includes substrate 16C which is textured on its upper surface for achieving a longer absorption path. This embodiment may be used in combination with or independently of the feature of the invention involving the reflecting substrate of FIG. 3. As illustrated in FIG. 4, cell 14C is deposited on substrate 16C and conforms to its texturing or irregularities in both its junction layer 32C and its base layer 34C. Similarly cell 12C conforms to the texturing in its base layer 26C and its junction layer 20C with a suitable grid 18C being applied. A typical bending of the light beam 44 is also illustrated. Numerical simulations indicate that approximately 10% increase in current is achieved as a result of the bending of incident light by the textured surface. A further advantage of the textured surface is trapping of light reflected from the surface of the first cell. A typical trapping of a reflected light ray 45 is also illustrated.

The texturing may be achieved in any conventional manner such as by a chemical etching or by mechanical means such as sand blasting. Further, the use of plasma deposition for the cell material is particularly amenable to the cell material conforming to its underlying irregularities. The result of this embodiment of the invention is to achieve a textured absorber layer in each cell. Preferably the magnitude of texturing approaches the thickness of the absorber layer The texturing angle is preferably 20° to 70°, while the texturing depth is preferably about 0.5 to 1.5 μm.

In accordance with this invention, if the substrate 16C' is a diffuse reflector, i.e. the texture is irregular as shown schematically in FIG. 4A, the light beam 44 (incident photons) enters device 10C' and the reflected photons 45 have a longer optical path and a large fraction of reflected photons strike the outer surface of the cell 10C' at an angle greater than the critical angle so that they are internally reflected back into the cell.

FIG. 5 illustrates a further aspect of this invention which involves the use of a graded gap junction layer. In accordance with this aspect of the invention, the device efficiency is increased further by having a lightly doped graded gap junction layer 32D in the material of cell 14D going from a high bandgap, such as a-(Si, Ge):H/F, to a low bandgap, such as a-(Si, Ge):H/F (prepared in a manner described later), within the p (or n) layer. This is because the built-in field created by the changing bandgap within the junction layer 32D of the material of cell 14D assists in minority carrier transport towards the junction. Thus, there is no longer a dependency mainly upon only the base layer 34D of cell 14D for carrier generation and collection; the junction layer 32D also contributes. Therefore, for a given $J^A$, the bandgap of cell 14D can be increased, since current is being generated in both junction layer 32D and base layer 34D of cell 14D, as compared to a no-grading case. Hence, $V^B$ increases; and device efficiency increases.

A graded layer may also be used for cell 12D. If the collection lengths are such that the optimum bandgap for cell 12D is less than a-Si:H/F alone, then a graded lightly doped junction layer for the material of cell 12D will help in increasing $J^A$, by using a principle similar to that discussed with respect to cell 14D. Since $J^A$ increases, $J^B$ can be increased by slightly reducing $E_g^B$, and thus reducing $V^B$. However, the net effect may be to increase efficiency, i.e., increase in $J^A$ may overpower decrease in $V^B$.

While the use of graded gap junction layers are known for single cells, the application to amorphous tandem cells is unique particularly when the preferred bandgap for the second cell is thereby increased. The use of a graded bandgap junction in the second cell is advantageous since the tunnel heterojunction thereby formed has greater optical transparency.

The grading function is about 0.2 eV/0.1 μm or $2 \times 10^4$ eV/cm. Typical values that might result from the practice of the invention of FIG. 5 is a bandgap $E_g^{A-1}$ of 1.8 eV at the top surface of 22D of junction layer 20D and a bandgap $E_g^{A-2}$ of 1.6 eV at the junction 24D of cell 12D. In accordance with this aspect of the invention, current collection is improved by having the junction layers graded in bandgap.

The use of graded gap junction in the second cell to allow a better tunnel diode and to increase efficiency of the second cell may not only be practiced for amorphous semiconductors but also the concept of using a graded-junction-layer may be used for any multiple junction cell to increase the bandgap of the second cell and thus increase its efficiency.

FIG. 6 illustrates a photovoltaic device 10E where the junction layers of both cells 12E and 14E (or of one of the cells) is a "transparent" junction layer, i.e., made from a material with a higher bandgap than the corresponding base layer. The purpose of this embodiment is to allow for increased current collection in either or both cells. Thus both of the cells are heterojunction cells as opposed to homojunction cells. Typical bandgaps in this embodiment are $E_g^{A-1}$ of 1.9 eV, $E_g^{A-2}$ of 1.65 eV, $E_g^{B-1}$ of 1.2 eV and $E_g^{B-2}$ of 1.05 eV. Such an arrangement results in providing a built-in field which would increase the efficiency of the respective cell.

Typical values for the bandgap in device 10A of FIG. 2 are 1.8 eV for junction layer 20A, 1.65 eV for base layer 26A including both its intermediate region 30A and base region 28A. The buffer layer 40 may also have a bandgap of 1.65 eV while the bandgap of junction layer 32A in cell 14A may be 1.25 eV and the bandgap of base layer 34A may be 1.1 eV. Where a reflective substrate is used, the bandgap of the second cell would be higher than with a non-reflective substrate.

Typical dimensions for a cell such as shown in FIG. 2 would be, for example, a thickness of 200–1000 Å for junction layer 20A of cell 12A, while intermediate region 26A would be of 5000–10000 Å and base region 28 would be 500–1000 Å. The thickness of buffer layer 40 would be about 500–1000 Å. Junction layer 32A of cell 14A would have a thickness of 100–500 Å, intermediate region 38A would have a thickness of 5000–10000 Å and base region 36A would have a thickness of about 1000 Å. The thickness of substrate 16A is not particularly critical and could range, for example, from 0.013 millimeters where aluminum foil is used to about 0.3 millimeters where a plate glass type material is used.

The present invention also involves novel methods of forming the illustrated devices. For example, an a-Si cell may be formed by adding hydrogen (H), fluorine (F) and oxygen (O) to the a-Si in amounts which can be determined by one skilled in the art so as to result in a bandgap of 1.95–2.00 eV. Alternatively, the additions may be simply H,O. By using plasma decomposition either DC or RF, the desired material may be made from $SiF_4+O_2+H_2$ which will result in a-Si:F. These techniques depart from the conventional approach which is usually limited to varying the hydrogen content for forming the desired a-Si material. Thus the invention broadens such prior approaches by the use of F,O or Ge additions to Si for the first higher bandgap cell to increase its bandgap and by the additions of O or F to Ge for the second lower bandgap cell.

Lower bandgap material of, for example, 1.5–1.6 eV may be formed from $SiH_4$ using known techniques such as described in Zanzucchi et al., J. Appl. Phys. 48(12), December, 1977, pages 5227–36. Further, a-Si material having a bandgap of 1.5–1.7 eV may be made directly from $SiH_4$ or from $SiF_4+H_2$ or from $SiH_4+HF$. Similarly, a-(Si, Ge) material having a bandgap of 1–1.25 eV may be made from $SiH_4+GeH_4$ which will produce a-(Si, Ge):H in accordance with the techniques described in Chevallier, Solid State Communications, Vol. 24, pp. 867–69, 1977. Alternatively such bandgap material may be produced from $SiF_4+GeH_4$. Still further, the bandgap can be increased by adding oxygen. For example, $O_2$ may be added to $SiH_4+GeH_4+HF$. The same techniques may be practiced for achieving the desired bandgap materials in a device having a first cell of a-(Si, Ge) with a lower bandgap second cell of an a-(Si, Ge).

The bandgap may also be varied to the desired amount by varying the deposition conditions such as temperature, pressure and RF power. Similarly the chemical composition may be varied as by changing the gas or chemical composition during decomposition. The hydrogen content can be controlled by varying the deposition temperature during the plasma deposition process.

The desired degree of doping can be achieved by suitable selection of materials. For example, with a-Si material an n-type doping can be achieved by using $AsH_3$, $PH_3$, $SbH_3$ while a p-type doping can be achieved by using $B_2H_6$, Al, Ga for a-(Si, Ge) material, n-type doping can be achieved by using $AsH_3$, $PH_3$ and p-type doping can be achieved by using $B_2H_6$.

The above techniques may be used for obtaining the same bandgap in two materials but with different polarity by changing the composition.

Although specific mention has been made of using germanium in the lower bandgap second cell, the invention may be practiced with a low bandgap a-Si second cell and a high bandgap a-Si first cell.

It is to be understood that the various individual features described above may be used in combination with each other as long as the features are compatible.

What is claimed is:

1. In a thin-film multiple-gap photovoltaic device having an opaque electrical contact and a transparent electrical contact with a first cell and a second cell therebetween and with the first cell being adjacent the transparent electrical contact and the second cell being adjacent the opaque electrical contact, each of the cells having a junction layer and a base layer and an electrical junction therebetween and each base layer comprising a base region and an intermediate region with the intermediate region being adjacent the electrical junction layer, the improvement being each of said cells being made from semiconductor materials selected from Group IV elements and their alloys in the amorphous state, said first cell having a higher bandgap than the bandgap of said second cell, and an optically transparent amorphous semiconductor buffer layer of the same conductivity type as the conductivity type of the junction layer of said second cell between said first cell and said second cell for connecting said cells together.

2. The photovoltaic device of claim 1 wherein said buffer layer has a bandgap higher than the bandgap of said second cell, and said junction layer of said second cell and said base region of said first cell being heavily doped.

3. The photovoltaic device of claim 2 wherein the bandgap of said buffer layer is no higher than the bandgap of said first cell.

4. The photovoltaic device of claim 2 wherein the bandgap of said buffer layer is the same as the bandgap of said base region of said first cell.

5. The photovoltaic device of claim 4 wherein said buffer layer is of the same material as the material of said base region of said first cell.

6. The photovoltaic device of claim 1 including at least one intermediate cell between said first cell and said second cell, said cells decreasing in bandgap in accordance with their respective locations from said transparent electrical contact where the bandgap is highest to said opaque electrical contact where the bandgap is lowest, and wherein said intermediate cell is adjacent at least one optically transparent amorphous buffer layer for connecting said cells together.

7. The photovoltaic device of claim 1 wherein said opaque electrical contact is a substrate having a light reflecting upper surface, and said second cell being mounted on said reflecting surface for reflecting photons into said second cell for a multiple pass therethrough for increasing the voltage thereof.

8. The photovoltaic device of claim 7 wherein said substrate is textured.

9. The photovoltaic device of claim 1 wherein said opaque electrical contact is a substrate having said second cell mounted thereon, and said substrate being textured for increasing the voltage of said second cell.

10. The photovoltaic device of claim 9 wherein said cells conform to the irregularities resulting from the texturing of said substrate.

11. The photovoltaic device of claim 10 wherein the magnitude of texturing is substantially equal to the thickness of the absorber layer of each cell.

12. The photovoltaic device of claim 1 wherein said junction layer in at least one of said cells is graded in bandgap from a high value to a low value toward its electrical junction to provide a built-in field for increasing the voltage and efficiency thereof.

13. The photovoltaic device of claim 12 wherein said junction layer of said second cell is graded to increase the collection efficiency of said second cell.

14. The photovoltaic device of claim 1 wherein said base and said junction layers of each of said cells are graded in bandgap energy to provide increased current collection in each of said cells.

15. The photovoltaic device of claim 1 wherein said junction layer in at least one of said cells is an optically transparent junction layer made from a material having a higher bandgap than its corresponding base layer to function as a heterojunction cell.

16. The photovoltaic device of claim 1 wherein each of said cells includes as its junction layer either $n^+$ or $p^+$ doping with its base region being the other of $n^+$ or $p^+$ and with the intermediate region being lightly or not intentionally doped.

17. The photovoltaic device of claim 1 wherein at least one of said cells includes as its semiconductor more than one Group IV element.

18. The photovoltaic device of claim 1 wherein said buffer lever has a thickness of about 500–1000 Å.

19. In a method of making a thin-film multiple-gap photovoltaic device wherein a first cell is formed on a second cell which is formed on an opaque electrical contact with a transparent electrical contact being formed on the first cell and wherein each cell includes a junction layer and a base layer with an electrical junction therebetween and with each base layer having a base region and an intermediate region, the improvement being forming each of said cells from semiconductor materials selected from Group IV elements and their alloys in the amorphous state, forming the first cell with a higher bandgap than the bandgap of the second cell, forming an optically transparent amorphous semiconductor buffer layer between the first cell and the second cell with the buffer layer having the same conductivity type as the conductivity type of the junction layer of the second cell and with the buffer layer having a bandgap higher than the bandgap of the second cell, and heavily doping the base region of the first cell and the junction layer of the second cell.

20. In the method of claim 19 including forming the opaque electrical contact as a substrate having a light reflecting upper surface on which the second cell is mounted for increasing the voltage thereof.

21. In the method of claim 19 including forming the opaque electrical contact as a substrate, and texturing the substrate before forming the second cell thereon to increase the voltage of the second cell.

22. In the method of claim 19 including grading the bandgap in the junction layer of at least one of the cells from a high value to a low value toward its electrical junction to provide a built-in field for increasing the voltage and efficiency thereof.

23. In the method of claim 19 including forming the junction layer of the first cell with a higher bandgap than its base layer, forming the base layer of the first cell with a higher bandgap than the junction layer of the second cell, and forming the junction layer of the second cell with a higher bandgap than its base layer.

24. In the method of claim 19 including forming at least one of the cells by the addition to silicon and hydrogen of a material selected from the group consisting of oxygen, fluorine and germanium.

25. In the method of claim 19 including forming at least one of the cells by the addition to germanium and hydrogen of a material selected from the group consisting of oxygen and fluorine.

26. In the method of claim 19 including forming the first cell of a high bandgap amorphous silicon, and forming the second cell of a lower bandgap amorphous silicon.

27. In the method of claim 19 including forming each cell with its junction layer of $n^+$ or $p^+$ doping and its base region of the other of $n^+$ or $p^+$ doping and with its intermediate region being lightly or not intentionally doped.

28. In the method of claim 19 including forming at least one of the cells from a semiconductor comprising more than one Group IV element.

29. The method of claim 19 including forming said buffer layer having a bandgap no higher than the bandgap of the first cell.

30. The method of claim 19 including forming said buffer layer from the same material as the material of said base region of said first cell is formed.

* * * * *